United States Patent
Daugherty et al.

(10) Patent No.: US 7,519,883 B1
(45) Date of Patent: Apr. 14, 2009

(54) METHOD OF CONFIGURING A SYSTEM AND SYSTEM THEREFOR

(75) Inventors: Daniel E. Daugherty, Loveland, CO (US); Brett A. Tischler, Longmont, CO (US); Steven J. Kommrusch, Fort Collins, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 534 days.

(21) Appl. No.: 11/098,861

(22) Filed: Apr. 5, 2005

(51) Int. Cl.
*G01R 31/28* (2006.01)

(52) U.S. Cl. .................. 714/726; 714/724; 714/727; 714/729; 714/742

(58) Field of Classification Search .............. None
See application file for complete search history.

(56) References Cited

U.S. PATENT DOCUMENTS

| | | | |
|---|---|---|---|
| 4,947,357 A | 8/1990 | Stewart et al. | |
| 5,163,155 A | 11/1992 | Omiya | |
| 5,347,523 A | 9/1994 | Khatri et al. | |
| 5,477,548 A * | 12/1995 | Beenker et al. | 714/727 |
| 5,530,749 A | 6/1996 | Easter et al. | |
| 5,592,493 A * | 1/1997 | Crouch et al. | 714/729 |
| 5,627,842 A | 5/1997 | Brown et al. | |
| 5,673,276 A * | 9/1997 | Jarwala et al. | 714/727 |
| 5,757,819 A | 5/1998 | Segars | |
| 5,841,791 A * | 11/1998 | Hashizume | 714/726 |
| 5,898,776 A * | 4/1999 | Apland et al. | 326/8 |
| 6,061,010 A | 5/2000 | Adams et al. | |
| 6,216,251 B1 | 4/2001 | McGinn | |
| 6,304,099 B1 | 10/2001 | Tang et al. | |
| 6,499,124 B1 * | 12/2002 | Jacobson | 714/727 |
| 6,539,511 B1 | 3/2003 | Hashizume | |
| 6,587,981 B1 * | 7/2003 | Muradali et al. | 714/726 |
| 6,754,862 B1 | 6/2004 | Hoyer et al. | |
| 6,760,874 B2 * | 7/2004 | Cote et al. | 714/724 |
| 6,804,725 B1 * | 10/2004 | Whetsel | 710/5 |
| 7,076,663 B2 * | 7/2006 | Kelley et al. | 713/184 |
| 7,185,249 B2 * | 2/2007 | Tkacik et al. | 714/726 |
| 7,246,282 B2 * | 7/2007 | Chau et al. | 714/724 |
| 2003/0126531 A1 | 7/2003 | Tu et al. | |
| 2004/0153801 A1 * | 8/2004 | Kayukawa et al. | 714/30 |
| 2006/0136858 A1 * | 6/2006 | Erickson et al. | 716/17 |
| 2006/0195901 A1 * | 8/2006 | Kelley et al. | 726/18 |

* cited by examiner

*Primary Examiner*—John P Trimmings

(57) ABSTRACT

A first scan data is received at a first scan chain and a representation of the first scan data is subsequently provided from the first scan chain to a second scan chain to test the second scan chain in response to a first value at a first bond pad. The first scan chain is bypassed to receive the first scan data at the second scan chain in response to a second value at the first bond pad.

12 Claims, 6 Drawing Sheets

US 7,519,883 B1

METHOD OF CONFIGURING A SYSTEM AND SYSTEM THEREFOR

BACKGROUND

1. Field of the Disclosure

The present disclosure relates generally to accessing system portions and more particularly to secure access of system portions.

2. Description of the Related Art

The ability to observe internal portions of a semiconductor device under test allows for efficient robust testing, thereby reducing manufacturing costs. Scan testing techniques are widely known and used to facilitate robust testing of semiconductor devices. One disadvantage of scan techniques is realized when systems being tested contain sensitive information, whether design related or data related, that as a result of scan logic becomes readily observable by end users. One technique has been proposed whereby sensitive data can be written, but not read by scan techniques. This, however, reduces the ability to test the device. Therefore, a method and system overcoming this problem would be useful.

BRIEF DESCRIPTION OF THE DRAWINGS

The present disclosure may be better understood, and its numerous features and advantages made apparent to those skilled in the art by referencing the accompanying drawings.

The use of the same reference numeral in different drawings indicates similar or identical items.

DESCRIPTION OF THE PREFERRED EMBODIMENTS

A system is disclosed to provide the ability to control access to various features of a semiconductor device. In a specific embodiment of the present disclosure disabling a portion of a scan chain is facilitated to prevent observability of the portion. Various aspects of the present disclosure are further described with reference to the accompanying figures discussed below.

Figure 1:
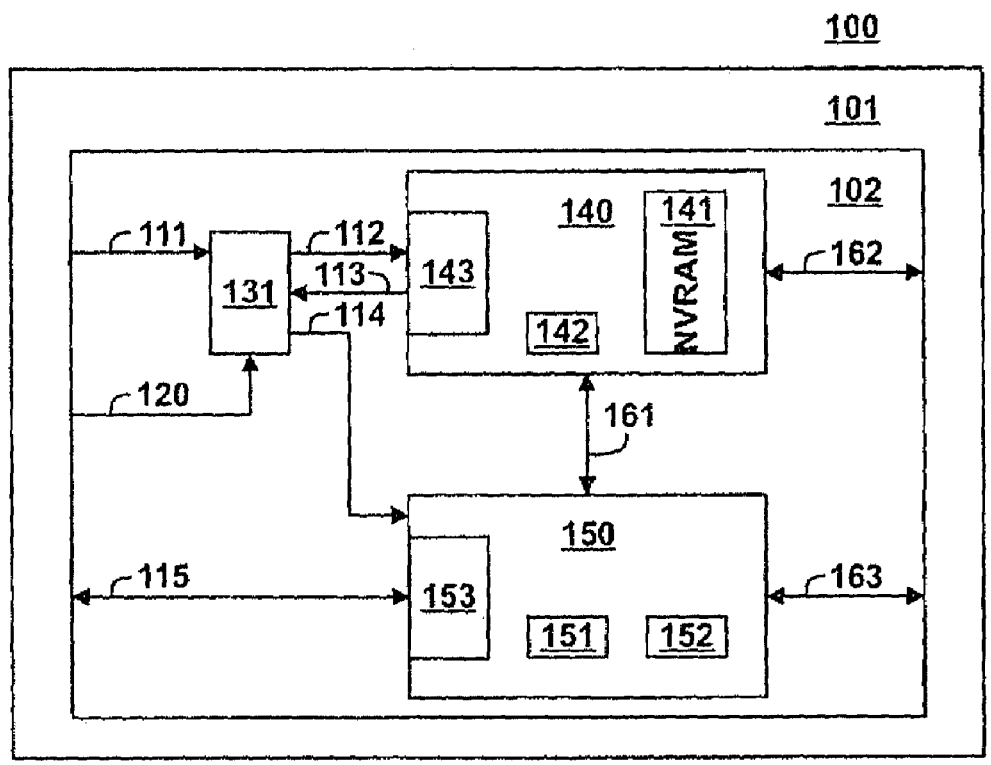
FIG. 1 illustrates in block diagram form a system formed on a semiconductor substrate in accordance with the present disclosure.

FIG. 1 illustrates in block diagram form a System 100 having scan test capabilities. In a particular embodiment System 100 has a plurality of components disposed at a semiconductor substrate to form a System-On-a-Chip (SOC). System 100 includes a logic core 102 and an Input/Output portion 101.

A plurality of modules is disposed at logic core portion 102 including scan chain enable module 131, modules 140, and modules 150. Scan chain enable module 131 has inputs connected to interconnects that provide scan input signals 111, select input signal 120, and scan output data 113. Outputs of scan chain enable module 131 are connected to interconnects that receive scan signals 112 and 114. Modules 140 have inputs connected to outputs of scan chain enable module 131 to receive scan signals 112, and inputs and outputs connected to interconnects to receive and send information 161 and information 162, and an output coupled to module 131 to provide scan out data 113. Modules 150 have inputs connected to outputs of scan chain enable module 131 to receive scan signals 114, inputs and outputs connected to outputs and inputs of modules 140 to receive and send information 161, and an output connected to an interconnect to provide scan output data 115, and inputs and outputs connected to interconnects to receive and send 163. Input/Output portion 101 is connected to scan chain enable module 131, modules 140, and modules 150 to provide input and output buffering capability between logic core portion 102 and components external System 100.

Figure 2:
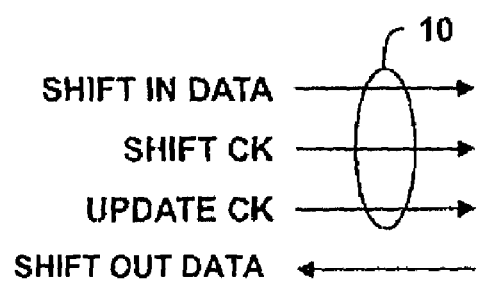
FIG. 2 illustrates in block and logic diagram form a specific embodiment of a portion of FIG. 1 in greater detail.

Scan input signals 111 and scan output data 115 represents scan test signals accessible external system 100 through Input/Output portion 101. Scan signals 112 and scan output data 113 represent scan signals to and from modules 140. Output signals 114 and scan output data 115 represent scan signals to and from modules 150. In a particular embodiment scan input signals 111, scan signals 112, and signals 114 are represented in FIG. 2 by signals 10, which include Shift In Data representing data to be shifted into a scan chain, Shift CK representing the signal used to shift data through a scan chain, and Update CK representing the signal that allows data shifted into a module to be provided at functional outputs of individual scan devices of the scan chain. Scan output data 113 and scan output data 115 represent data shifted out (Shift Out Data) from a module's scan chain.

Module 140 includes module 141 and module 142 that are a subset of the modules that make up System 100, and scan chain 143 that is connected to module 141 and module 142 so that they can be observed and controlled. Module 150 includes module 151 and module 152 that are a subset of the modules that are part of System 100, and scan chain 153 that is connected to module 151 and module 152 so that they can be observed and controlled by scan chain 153. Note that the scan chains 143 and 153 represent those scan logic portions that facilitate scan testing. As such, it will be appreciated that a scan logic device will typically be represented by a scan chain portion (e.g., 143), while its base logic function is represented by other modules (e.g., 141 and 142).

In one mode of operation scan chain enable module 131 operably connects scan chain 143 to scan chain 153 to form a longer functional scan chain enabling portion of any given chain to test/control both modules 140 and modules 150. In an alternate mode of operation, scan chain enable module 131 operably bypasses scan chain 143 to form a functional scan chain that cannot observe modules 140, thereby preventing their being tested via the scan chain. Whether scan chain enable module 131 includes scan chain 143 as part of the functional scan chain, i.e. the scan chain observable from the external system 100, is based upon a value of select input signal 120. In one embodiment select input signal 120 is based upon a value asserted at a bond pad as illustrated in FIGS. 3 and 4.

Figure 3:
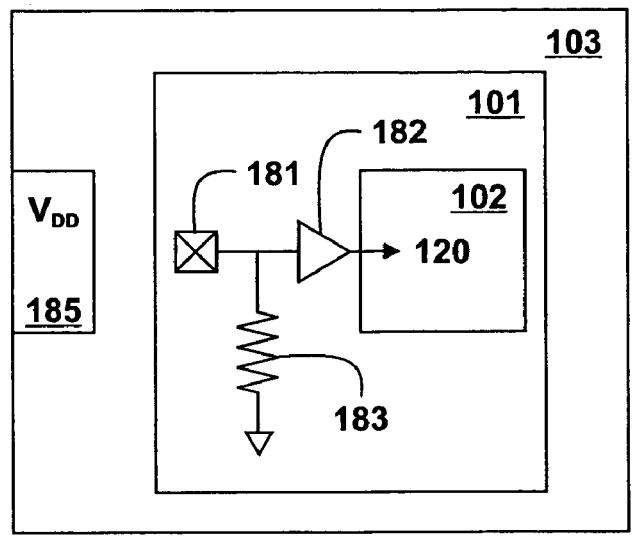
FIGS. 3 and 4 illustrate in block and logic diagram form systems having the system of FIG. 1 disposed on a package substrate in accordance with specific embodiments of the present disclosure.
Figure 4:
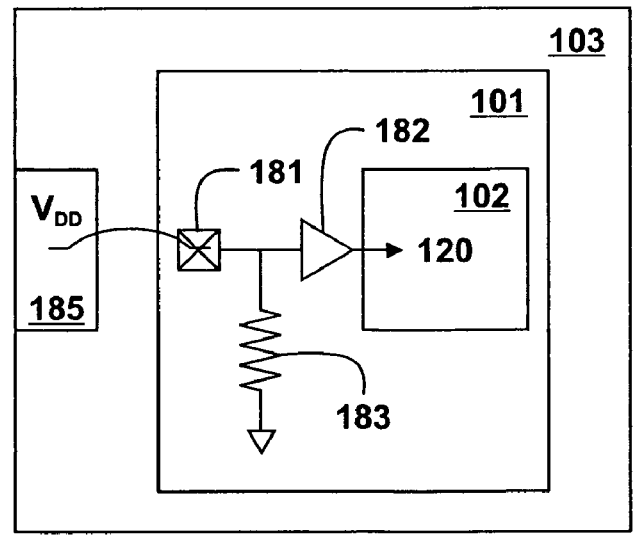

FIG. 3 illustrates bond pad 181 connected to bias structure 183 and input buffer 182 to provide select input signal 120. A value of select input signal 120 will be based upon a signal at bond pad 181. In the specific embodiment illustrated bond pad 181 will have a default value defined by the ground reference connected to the bias structure 183, which is illustrated as a resistor.

Whether the default value of bond pad 181 facilitates inclusion or exclusion of scan chain 143 from the functional scan chain is predetermined by specific design requirements. For example, in one embodiment the default value for bond pad 181 excludes scan chain 143 from the functional scan chain. However, during probe testing bond pad 181 can receive a value from test equipment to over-ride the default value allowing test/control of modules 140. Subsequent to probe testing System 100 can be disposed on a package substrate 103 and bond pad 181 can be bonded to a voltage reference portion of the package substrate or remain un-bonded. When bond pad 181 remains un-bonded, as in FIG. 3, the packaged system will provide a value of select input signal 120 based upon the SOC bias structure 183, which will include or exclude modules 140 based upon predetermined design constraints. Alternatively, bond pad 181 can be bonded to a voltage reference of the package, see bond wire bond pad 181 of FIG. 4 connected to package bond location 185, to over-ride the default value during operation. Note that bond pad 181 can also be bonded to a voltage reference of the package substrate that is similar to the default value and obtain the same result as not bonding bond pad 181. In yet another embodiment bond pad 181 can be bonded to an input pin for controllability external system 100.

Figure 5:
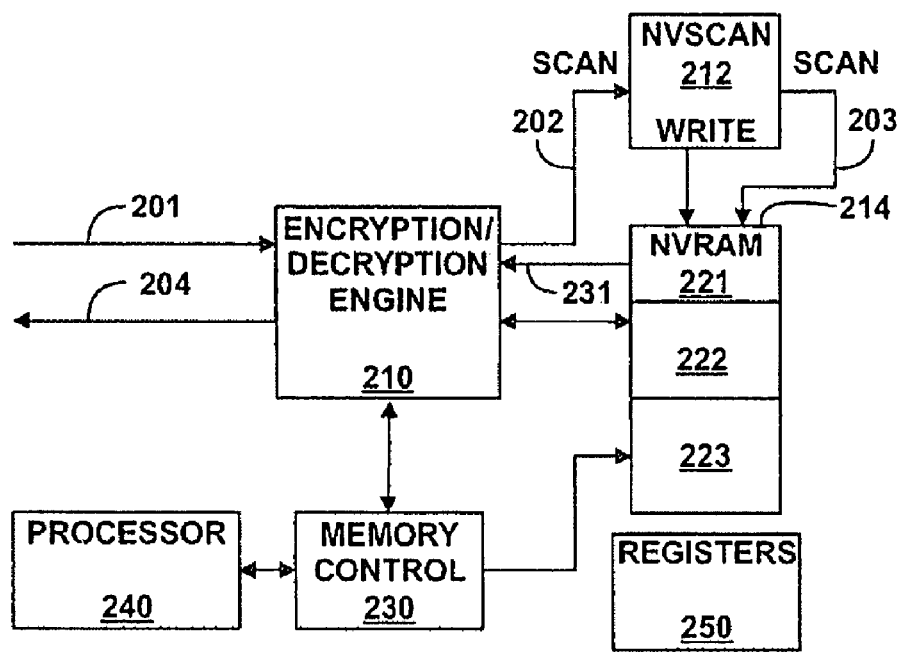
FIG. 5 illustrates in block diagram form a specific embodiment of a portion of FIG. 1 in greater detail.

FIG. 5 illustrates a specific embodiment of a system in accordance with the present disclosure. The system of FIG. 5 includes Encryption/Decryption module 210, Non-Volatile Scan Write Module 212, Non-Volatile Memory 214, Memory Control 230, Processor 240, and Registers 250. Non-Volatile Memory 214 includes Integrated Non-Volatile Memory 221 and Integrated Non-Volatile Memory 222, which are non-volatile memories disposed on a common substrate with Encryption/Decryption module 210, Registers 250, and Non-Volatile Memory 223, which is non-volatile memory formed on a different substrate than Memory 221.

Figure 6:
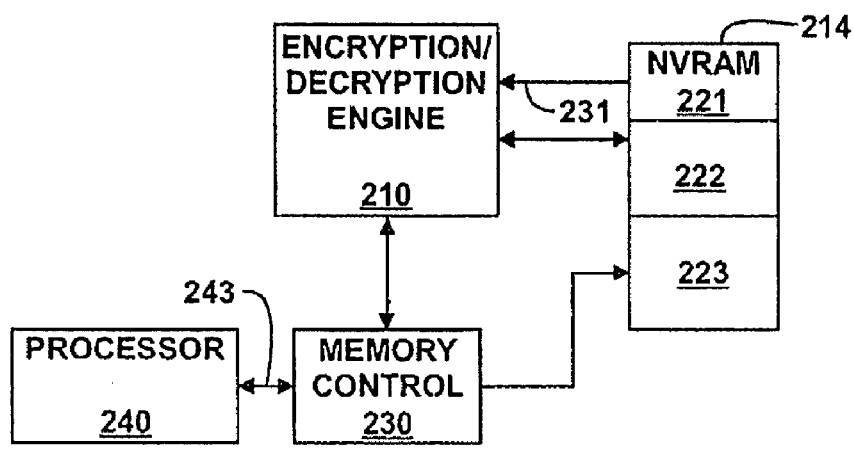
FIG. 6 illustrates in block diagram form a portion of the embodiment of FIG. 6.

Elements 201, 202, 203, 231, and 204 represent portions of a scan chain to test/control Encryption/Decryption module 210, Non-Volatile Scan Write Module 212, and Integrated Non-Volatile Memory 221. FIG. 6 represents the system of FIG. 5 without illustrating the scan chain elements of FIG. 5.

In one embodiment, Encryption/Decryption module 210, Non-Volatile Scan Write Module 212, and Integrated Non-Volatile Memory 221 are part of modules 140 and elements 201, 202, 203, 231, and 204 are part of scan chain 143, which can be removed from the functional scan chain of System 100 subsequent to test. The ability to remove these modules from the functional scan chain after test can be useful to secure data written through the scan chain to write a value, such as private or public key values used for encryption and decryption, into Integrated Non-Volatile Memory 221 for use by Encryption/Decryption module 210. For example, Non-Volatile Scan Write Module 212 can be loaded with data and control information during scan test to store a private key that is read-only accessible by Encryption/Decryption module 210 in normal operation (i.e. not in scan mode) and not observable (unobservable) at bond pads of System 100, thereby allowing data at Integrated Non-Volatile Memory 221 to be secured from external read and write access.

Figure 7:
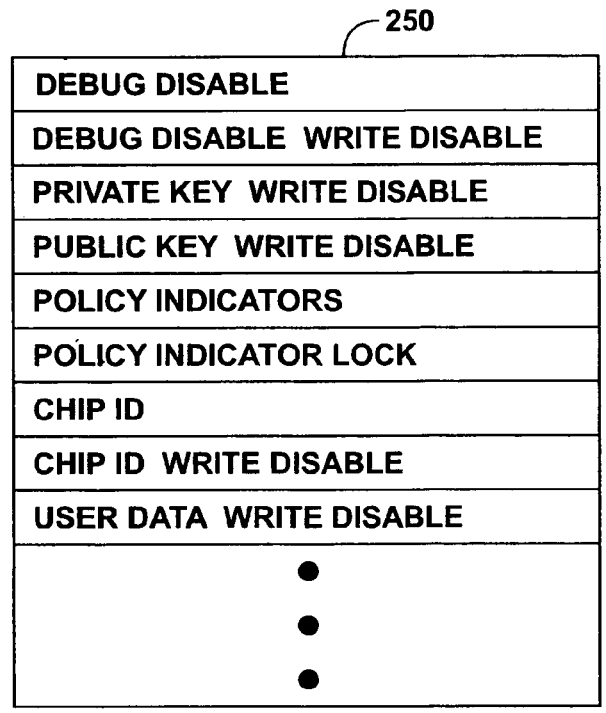
FIG. 7 illustrates in block diagram form a set of registers in accordance with a specific embodiment of the present disclosure.

Modules 150 (FIG. 1), which remain in the functional scan chain of System 100, may include Processor 240, Memory Control 230, Registers 250, External Non-Volatile Memory 222, and portions of Encryption/Decryption module 210. FIG. 7 illustrates a specific embodiment of Registers 250, which store values used to control various features of System 100. One field of Registers 250 is labeled DEBUG DISABLE and is used to disable various debug capabilities of a debug module of System 100. In one embodiment the value of DEBUG DISABLE can be set to remove modules 140 from the scan chain, in a similar manner described with reference to bond pad 181. In this manner, System 100 can be fully tested/controlled by a user who can subsequently remove modules 140 from the functional scan chain of System 100 after writing data to Memory 221. In an alternate embodiment the debug features disabled by DEBUG DISABLE include the ability to scan out the state of all register contents associated with modules 140. Once the field or fields represented by DEBUG DISABLE are set, they can be locked to prevent subsequent writing by writing an appropriate value to the register field labeled DEBUG DISABLE WRITE DISABLE. In one embodiment this register field is a write-once field that once enabled cannot be overwritten.

Another field of Registers 250 is labeled PRIVATE KEY WRITE DISABLE and is used to prevent a storage area that maintains a private key for use by an encryption/decryption engine from being overwritten. In one embodiment this field is a write-once field that once enabled cannot be disabled.

Another field of Registers 250 is labeled PUBLIC KEY WRITE DISABLE and is used to prevent a storage area that maintains a public key for use by an encryption/decryption engine from being overwritten. In one embodiment this field is a write-once field that once enabled cannot be disabled.

Another field of Registers 250 is labeled POLICY INDICATORS and is used to indicate various policies to be implemented by System 100. Debug modes and write access abilities of the system are examples of specific policies. The field of Registers 250 labeled POLICY INDICATOR LOCK is used to prevent a storage area that maintains a policy indicator from being overwritten. In one embodiment this field is a write-once field that once enabled, cannot be disabled.

Another field of Registers 250 is labeled CHIP ID and can be written to store a chip identifier. Overwriting of this field is prevented by asserting a predefined value at the field labeled CHIP ID WRITE DISABLE.

Another field of Registers 250 is labeled USER DATA WRITE DISABLE and is used to prevent a storage to a user data area, which may be off chip (i.e. External Non-Volatile Memory 222) or on chip (Integrated Non-Volatile Memory 223).

Figure 8:
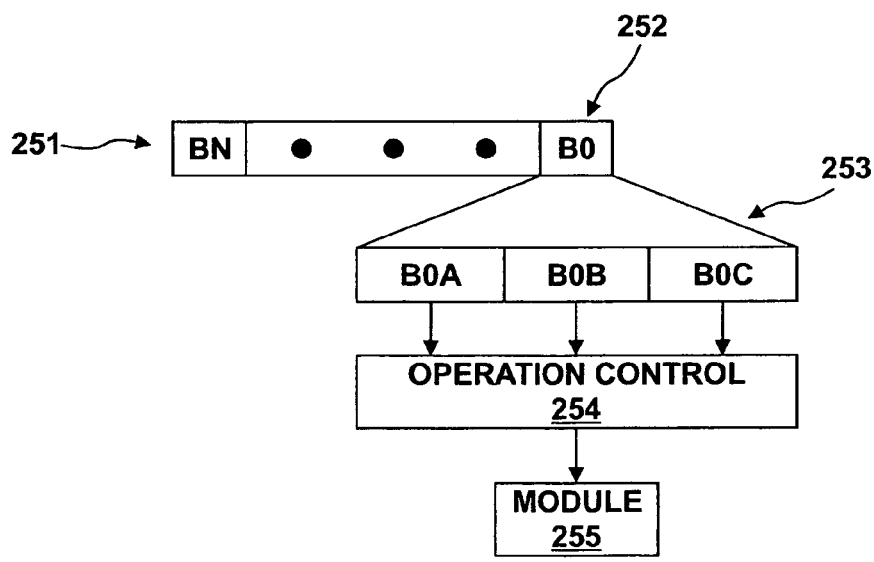
FIG. 8 illustrates in block diagram form a portion of FIG. 5 in a specific embodiment and in greater detail.
Figure 9:
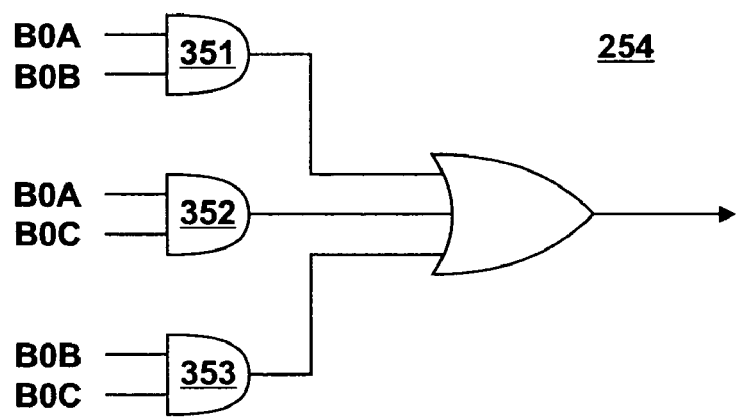
FIG. 9 illustrates in logic diagram form a portion of FIG. 8 in greater detail for a specific embodiment of the disclosure.

FIG. 8 illustrates a portion 251 of Registers 250 including register fields Bn-B0. Fields Bn-B0 represents register fields having one or more bits. Field B0 is specifically illustrated to have a plurality of field locations B0A, B0B, and B0C to facilitate redundant storage of a field value of field B0. Each of the redundant field locations is accessed by control 254 to determine an appropriate control value to be provided to the module 255 that it controls. FIG. 9 illustrates a simple logic diagram that will assert a low value at its output in response to two or more of the bits B0A, B0B, and B0C having a low value, or asserting a high value at its output in response to two or more of the bits B0A, B0B, and B0C having a high value in accordance with a specific embodiment of the disclosure. Use of redundant field locations is useful to prevent spurious errors resulting from a single location being misread or misstored, thereby rendering features of a system insecure.

Figure 10:
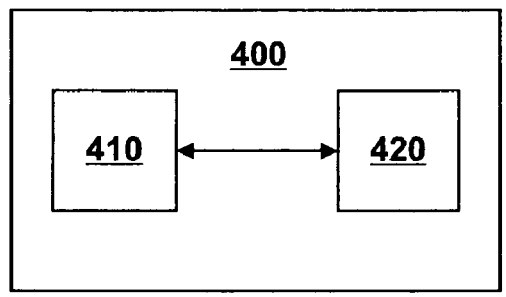
FIG. 10 illustrates in block diagram form a multi-chip module in accordance with a specific embodiment of the present disclosure.

FIG. 10 illustrates a multi-chip module 400 having a plurality of components 410 and 420. In one embodiment, component 420 includes elements similar to Encryption/Decryption module 210, Non-Volatile Scan Write Module 212, Integrated Non-Volatile Memory 221, External Non-Volatile Memory 222, Memory Control 230, Processor 240, and Registers 250, while component 420 represents Integrated Non-Volatile Memory 223.

Figure 11:
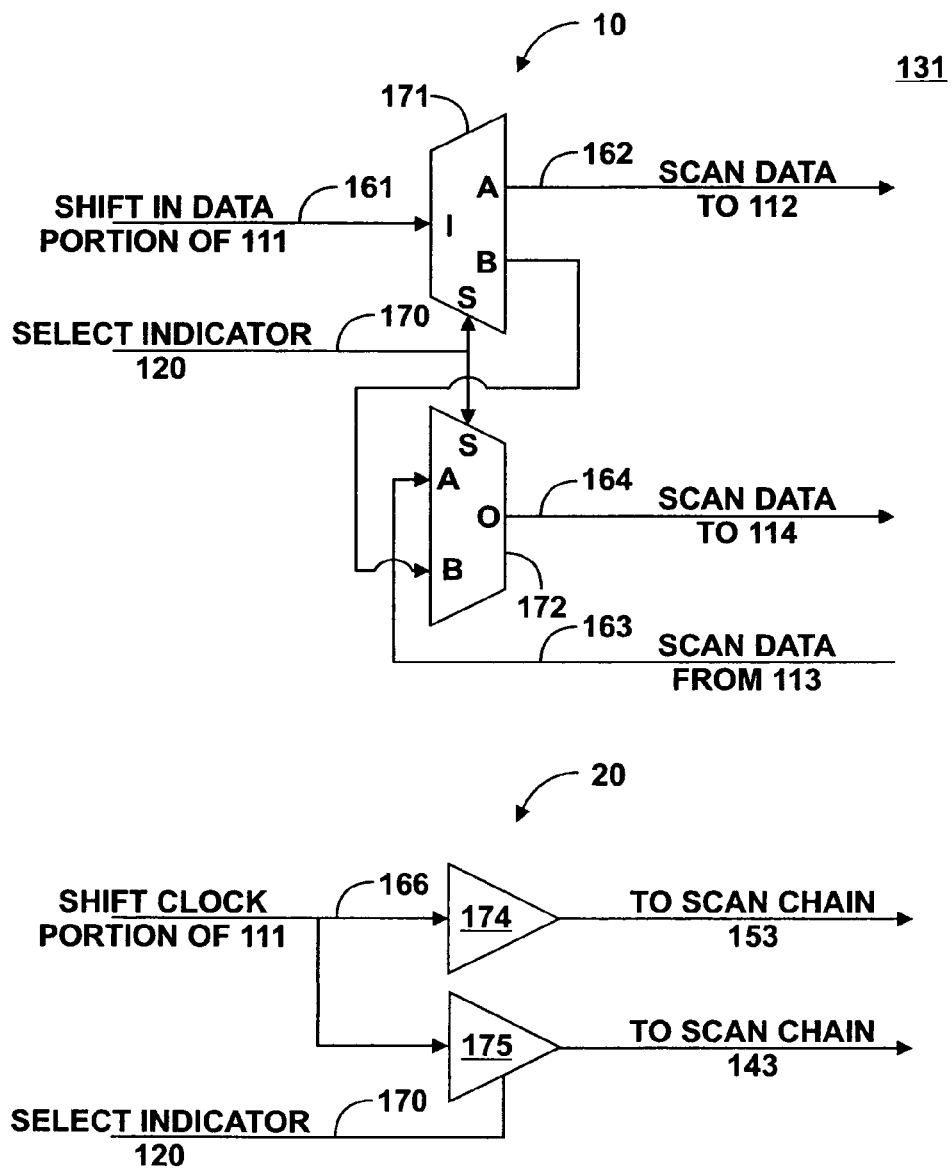
FIG. 11 illustrates in logic diagram form a portion of FIG. 1 in greater detail for a specific embodiment of the disclosure.

FIG. 11 illustrates a simple logic diagram representing a specific embodiment of a portion of the scan chain enable module 131. Logic portions 10 and 20 illustrate a specific embodiment of routing scan chain Shift-In Data and Shift CK. Specifically, when Modules 140 is to be included in the function scan chain of system 100, based upon the value of Select Indicator 120, the Shift In Data at node 161 is provided by demultiplexor 171 to Modules 140 via to node 162. Scan data shifted from Modules 140 is provided to input A of multiplexor 172 via node 163 and thereby provided to Modules 150, via node 164, based upon the Select Indicator 120 value. In this manner both Modules 140 and 150 are included in the functional scan chain. When Modules 140 is to be excluding from the function scan chain of system 100, based upon the value of Select Indicator 120, the Shift In Data at node 161 is provided by demultiplexor 171 to input B of Multiplexor 172, which in turn selectively provides the information received at input B to Modules 150 via to node 164.

Logic portion 20 of FIG. 11 indicates that the Shift CK, at node 166, can be selectively disabled based upon the value of select indicator 120, at node 170, to prevent clocking data to Modules 140

Other embodiments, uses, and advantages of the present disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A system comprising:
a semiconductor substrate comprising a plurality of modules, the plurality of modules comprising a first subset of modules and a second subset of modules, wherein the first subset of modules is mutually exclusive of the second subset of modules;
the first subset of modules testable by a first scan chain, and including a first non-volatile memory, the first scan chain comprising a first input to receive a first scan data for the first subset of modules, a second input to receive a first signal to shift data at the first input through the first scan chain, and a first output to provide second scan data from the first scan chain;
the second subset of modules testable by a second scan chain, the second scan chain comprising a first input to receive a third scan data for the second subset of modules, a second input to receive a second signal to shift data at the first input through the second scan chain, and a first output to provide a fourth scan data from the second scan chain;
a scan chain enable module comprising a first input coupled to a bond pad of the semiconductor substrate to receive a select indicator, a second input coupled to receive a third signal to shift scan data, a third input to receive scan-in data to test at least the second subset of modules, a fourth input coupled to the first output of the first subset of modules, a first output coupled to the first input of the first subset of modules to provide a representation of the scan-in data in response to the select indicator having a first value, a second output coupled to the first input of the second subset of modules to provide a representation of the scan-in data in response to the select indicator having a second value, and to provide a representation of the second scan data from the first scan chain in response to the select indicator having the first value;
the scan chain enable module further comprising a shift enable module comprising a first input coupled to the first input of the scan chain enable module, a second input coupled to the second input of the scan chain enable module, and an output coupled to the second input of the first subset of modules to provide the first signal, the shift enable module to provide a representation of a signal received at its second input to its output in response to the select indicator having the first value and to refrain from providing the representation of the signal received at its second input to its output in response to the select indicator having the second value; and
a second non-volatile memory and a first field to store a field value, wherein, in response to the first field having a first field value, the second non-volatile memory can be written to, and in response to the first field having a second, field value, the second non-volatile memory is read-only.

2. The system of claim 1 wherein the first subset of modules includes at least a portion of an encryption/decryption engine.

3. The system of claim 2 wherein the first non-volatile memory is observable to the encryption/decryption engine and unobservable at bond pads of the semiconductor substrate.

4. A system comprising:
a semiconductor substrate comprising a plurality of modules, the plurality of modules comprising a first subset of modules and a second subset of modules, wherein the first subset of modules is mutually exclusive of the second subset of modules;
the first subset of modules testable by a first scan chain, and including at least a portion of an encryption/decryption engine and a first non-volatile memory, the first non-volatile memory is writable through the first scan chain and is read-only in response to a select indicator having a second value, the first scan chain comprising a first input to receive a first scan data for the first subset of modules, a second input to receive a first signal to shift data at the first input through the first scan chain, and a first output to provide second scan data from the first scan chain;
the second subset of modules testable by a second scan chain, the second scan chain comprising a first input to receive a third scan data for the second subset of modules, a second input to receive a second signal to shift data at the first input through the second scan chain, and a first output to provide a fourth scan data from the second scan chain;
a scan chain enable module comprising a first input coupled to a bond pad of the semiconductor substrate to receive the select indicator, a second input coupled to receive a third signal to shift scan data, a third input to receive scan-in data to test at least the second subset of modules, a fourth input coupled to the first output of the first subset of modules, a first output coupled to the first input of the first subset of modules to provide a representation of the scan-in data in response to the select indicator having a first value, a second output coupled to the first input of the second subset of modules to provide a representation of the scan-in data in response to the select indicator having a second value, and to provide a representation of the second scan data from the first scan chain in response to the select indicator having the first value;

the scan chain enable module further comprising a shift enable module comprising a first input coupled to the first input of the scan chain enable module, a second input coupled to the second input of the scan chain enable module, and an output coupled to the second input of the first subset of modules to provide the first signal, the shift enable module to provide a representation of a signal received at its second input to its output in response to the select indicator having the first value and to refrain from providing the representation of the signal received at its second input to its output in response to the select indicator having the second value; and a second non-volatile memory and a first field to store a field value, wherein, in response to the first field having a first field value, the second non-volatile memory can be written to, and in response to the first field having a second field value, the second non-volatile memory is read-only.

5. The system of claim 4 further comprising a third non-volatile memory coupled to a register field, wherein, in response to the second field having a third field value, the third non-volatile memory is writable, and in response to the second field having a second field value, the third non-volatile memory is read-only.

6. The system of claim 4 wherein the first field comprises a plurality of locations to facilitate redundant storage of field values.

7. The system of claim 6 wherein the plurality of locations is three.

8. The system of claim 7 further comprising a second field to store a field value, wherein a capability of a debug module is enabled in response to a third field value being stored at the second field, and a capability of the debug module is disabled in response to a fourth field value being stored at the second field.

9. The system of claim 7 further comprising a second field to store a field value, wherein observability of a non-volatile key location, coupled to the encryption decryption engine, of the second non-volatile memory is enabled in response to a third field value being stored at the second field, and observability of the non-volatile key location is disabled in response to a fourth field value being stored at the second field.

10. The system of claim 9 wherein the first field is a write-once register field.

11. The system of claim 6 wherein the first field is a write-once register field.

12. The system of claim 11 wherein the plurality of locations is three.

* * * * *